March 10, 1970 B. R. EISENBERG 3,500,226

APPARATUS FOR REDUCING THE STATIC OFFSET IN A PHASE-LOCKED OSCILLATOR

Filed May 17, 1968

INVENTOR
B. R. EISENBERG
BY Leonard D. Arnold
ATTORNEY

United States Patent Office 3,500,226

Patented Mar. 10, 1970

3,500,226

APPARATUS FOR REDUCING THE STATIC OFFSET IN A PHASE-LOCKED OSCILLATOR

Barry R. Eisenberg, Matawan, N.J., assignor to Bell Telephone Laboratories Incorporated, Murray Hill, N.J., a corporation of New York Filed May 17, 1968, Ser. No. 730,042

Int. Cl. H03b 3/04

U.S. Cl. 331—15 4 Claims

ABSTRACT OF THE DISCLOSURE

A phase-locked oscillator is disclosed having a second control path from the phase comparator to the voltage controlled oscillator. By adding a simple control circuit consisting of a resistor and a capacitor in the second path, the static offset required to match the frequency of the voltage controlled oscillator with the input frequency is reduced by a factor of two without the use of an amplifier. The only requirement is that the signal in the second path be the complement of the signal in the first path from the phase comparator so that both signals may be added by placing them across opposite ends of the control element in the voltage controlled oscillator.

BACKGROUND OF THE INVENTION

This invention relates to apparatus for reducing the static offset in phase-locked oscillator circuits.

The function of a phase-locked oscillator generally is to produce an output signal whose frequency and phase are controlled by an input signal. A well known example of a phase-locked oscillator used to perform this function is described in Byrne, "Properties and Design of the Phase Controlled Oscillator With a Sawtooth Comparator", 41 Bell System Technical Journal 559 (1962).

The two basic elements of a phase-locked oscillator are the voltage controlled oscillator, which generates the output signal, and the phase comparator, which adjusts the frequency of the voltage controlled oscillator by comparing the input signal with the output signal. The output signal from the voltage controlled oscillator is fed back to the phase comparator to form a servo loop. Hence, a phase-locked oscillator circuit is also commonly known as a phase-locked loop.

Ideally, the center frequency of the voltage controlled oscillator is tuned to the frequency of the input signal and is 180 degrees out of phase with the input signal. When this is the case the phase error between the input signal and the signal from the voltage controlled oscillator can vary over a maximum range, determined by the capacity of the particular phase comparator.

If the input frequency and the center frequency of the voltage controlled oscillator do not match, a control signal appears at the output of the phase comparator to adjust the frequency of the voltage controlled oscillator. In most cases a direct-current component is required in the signal from the phase comparator. This direct-current signal, called the static offset signal, occurs in practical systems to compensate for a steady state change of the input frequency and/or to compensate for a change in the center frequency of the voltage controlled oscillator caused by a change in temperature or by aging of the elements.

In order to provide the necessary control signal, the phase relation between the input signal and the signal from the voltage controlled oscillator must change. As a result of this phase change the capacity of the phase comparator to tolerate further change is decreased. If the total phase error goes beyond tolerable limits, a discontinuity occurs in the output of the phase comparator causing the phase-locked oscillator to function improperly.

Thus, when a static offset signal appears from the phase comparator the operating range of the phase-locked oscillator is decreased. Stated differently this means that the static offset signal is directly related to the static phase offset between the input signals to the phase comparator. In a phase comparator such as shown in FIG. 1, for example, the phase offset between the input pulses and the pulses from the voltage controlled oscillator cannot exceed ±180 degrees. Beyond that point, the pulses at the set and reset inputs pass each other in time so that either two set or two reset pulses occur before the next reset or set pulse respectively. In order to provide a positive control signal to bias the voltage controlled oscillator, the set pulses from the input signal must occur relatively soon (less than 180 degrees) after the reset pulses. Because of this, the operating range is narrower (less than 180 degrees) than in the ideal case wherein the reset pulses occur 180 degrees out of phase with the set pulses. With the narrower operating range, a further phase change of less than 180 degrees will cause a discontinuity in the output of the phase comparator and result in improper operation of the phase-locked oscillator.

SUMMARY OF THE INVENTION

In the prior art the voltage on the control element in the voltage controlled oscillator, such as shown in Gardner, Phaselock Techniques (John Wiley & Sons 1966) at page 67, is provided by the difference between a fixed reference voltage and the control voltage provided by the filtered signal from the output of the phase comparator. In the present invention a second control path is added from the phase comparator to the voltage controlled oscillator to reduce the direct-current, or static offset, signal required to match the frequency of the voltage controlled oscillator with the input frequency. The fixed reference voltage found in the prior art is replaced by a variable bias provided by the signal from a second output of the phase comparator. The only requirement is that the two outputs of the phase comparator carry signals which are the complement of each other so that the two signals may be effectively summed by placing them across opposite ends of the control element in the voltage controlled oscillator.

In an illustrative embodiment of the present invention a simple control circuit consisting of a series resistor and a shunt capacitor is used in the second control path to provide a direct-current signal from the second output of the phase comparator. Since the complementary signals in the two control paths are then added in the voltage controlled oscillator, the direct-current component required in the first path is reduced by a factor of two.

The advantage gained from the use of the second control path is that the static offset is reduced in an economical and efficient manner without the use of an amplifier. By reducing the direct-current component of the first control signal from the phase comparator the operating range of the phase-locked oscillator is increased and discontinuities are avoided. Moreover, since only a substantially direct-current signal is passed through the control circuit in the second path, there is no interference or change in the transient response of the phase-locked oscillator.

DETAILED DESCRIPTION

Figure 1:
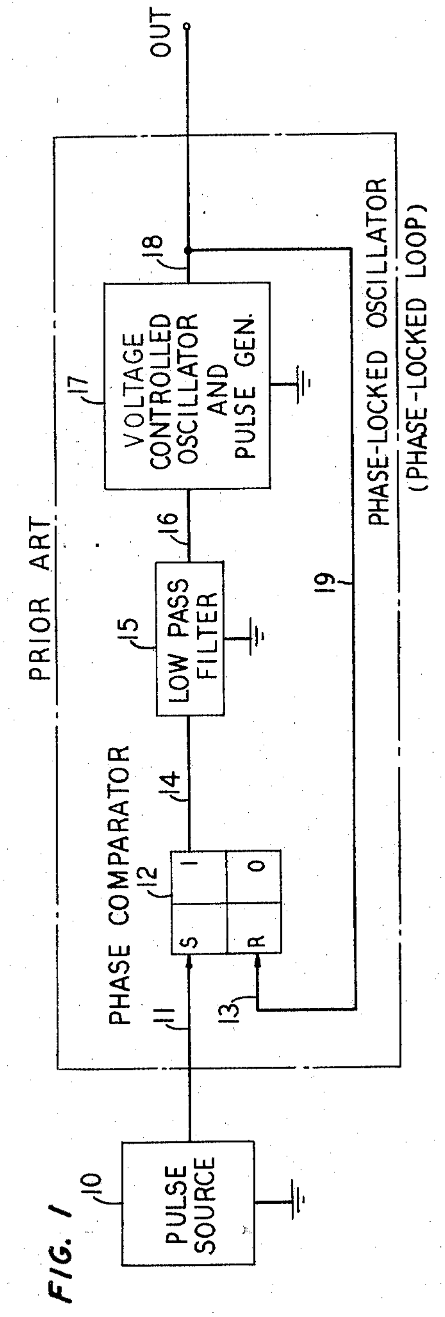
FIG. 1 shows a block diagram of a phase-locked oscillator circuit known in the prior art.

A generalized block diagram of a phase-locked oscillator such as described in the Byrne article, cited above, is shown in FIG. 1 of the drawings. An input signal is supplied by pulse source 10 to input 11 of phase comparator 12. As indicated above, the function of the phase-locked oscillator circuit is to produce a signal at output 18 of the voltage controlled oscillator 17 whose frequency and phase are controlled by the input signal from pulse source 10. The pulse generator circuit in voltage controlled oscillator 17, as shown, generates one pulse for each cycle of the voltage controlled oscillator to provide a pulse signal at output 18.

In the absence of a control signal from the phase comparator 12, the voltage controlled oscillator 17 oscillates at a predetermined center frequency. If the center frequency appearing at input 13 matches the frequency of the input signal appearing at input 11, there is no need for adjustment. If the frequency of the input signal and the voltage controlled oscillator do not match, phase comparator 12 produces a signal which adjusts the frequency of the voltage controlled oscillator.

Essentially, phase comparator 12, shown in the phase-locked oscillator in FIG. 1, is a bistable multivibrator or flip-flop circuit. The pulses from pulse source 10 trigger the set input 11 and the pulses from the output of the voltage controlled oscillator 16 trigger the reset input 13. Each time the set trigger is activated the flip-flop is switched to the "1" state and each time the reset trigger is activated the flip-flop is switched to the "0" state. The output signal appearing at the "1" output 14 is a square wave with the high levels occurring each time set input 11 is triggered and the low levels occurring each time the reset input 13 is triggered.

The filtered signal, appearing at input 16 through low-pass filter 15, reflects the average value of the square wave at output 14 and controls the voltage across the control element in voltage controlled oscillator 17. When the voltage across the control element changes, the frequency of oscillation of the voltage controlled oscillator changes correspondingly. In most classical voltages controlled oscillators, such as described in Gardner, "Phaselock Techniques" (John Wiley and Sons, Inc., 1966) at page 67, the control element is a variable capacitance diode.

Output 18 of voltage controlled oscillator 17 in FIG. 1 is fed back to phase comparator 12 to form servo loop 19. By this feedback technique the frequency of the voltage controlled oscillator is continuously adjusted to match the input frequency.

Ideally, the center frequency of voltage controlled oscillator 17 is tuned to match the steady state frequency of the pulses from pulse source 10. When that is the case, the triggering pulses for the set and the reset inputs of the phase comparator 12 are 180 degrees out of phase so that the average value of the square wave at output 14 will be zero. Since the signal at the output of the low-pass filter 15 reflects this average value, the offset voltage across the control element in the voltage controlled oscillator will be zero.

When the input frequency of the pulse train from pulse source 10 is not identical to the frequency of the pulse train at the output of the voltage controlled oscillator 17, the set input to the phase comparator 12 will be triggered either early or late relative to the reset input so that the signal at output 14 will be a square wave whose average value is not zero. This change is reflected in the value of the signal at the output of low-pass filter 15. As a result, the frequency of the oscillation of the voltage controlled oscillator 17 adjusts to the frequency of input pulse source 10.

In working systems the signal from pulse source 10, which triggers the set input to phase comparator 12, contains two basic components. One component is a steady state frequency component, which represents the nominal value of the input frequency over a long time period. The other component is a so-called "jitter" component, which represents all the unwanted random and periodic variations from the nominal steady state frequency.

As described above, variations in the input signal are reflected in the signal at the output of phase comparator 12 by variations in the time that the set input 11 is triggered with respect to the reset input 13. Ideally, it is desirable to filter all unwanted variations in low-pass filter 15 so that the voltage controlled oscillator will follow or "track" only the nominal steady state frequency. In practice, however, phase comparator 12 can tolerate only a given amount of phase change between the input frequency and the frequency of the voltage controlled oscillator before a discontinuity occurs in its output signal. To avoid this condition the portions of the jitter component which have a relatively large magnitude must be tracked by voltage controlled oscillator 17.

In the ideal case, as indicated above, the pulses at the set and reset inputs of the phase comparator are 180 degrees out of phase. But, when a direct-current "00" static offset signal is provided to the voltage controlled oscillator, the set and reset pulses are no longer 180 degrees out of phase. If, for example, a positive static offset signal is needed to adjust the frequency of the voltage controlled oscillator, the set pulses must occur relatively soon (less than 180 degrees) with respect to the reset pulses to produce a square wave at the output of phase comparator 12 whose average value is positive. The square wave is filtered in low-pass filter 15 to provide the positive control signal to voltage controlled oscillator 17. As can be appreciated, with a large static offset signal only small variations from the nominal frequency can be tolerated before the set and reset pulses pass each other in time to cause a discontinuity in the output of phase comparator 12. As a result, the overall ability of the phase-locked oscillator to filter the unwanted variations is reduced, and a greater portion of the unwanted variations must be tracked by voltage controlled oscillator 17.

Figure 2:
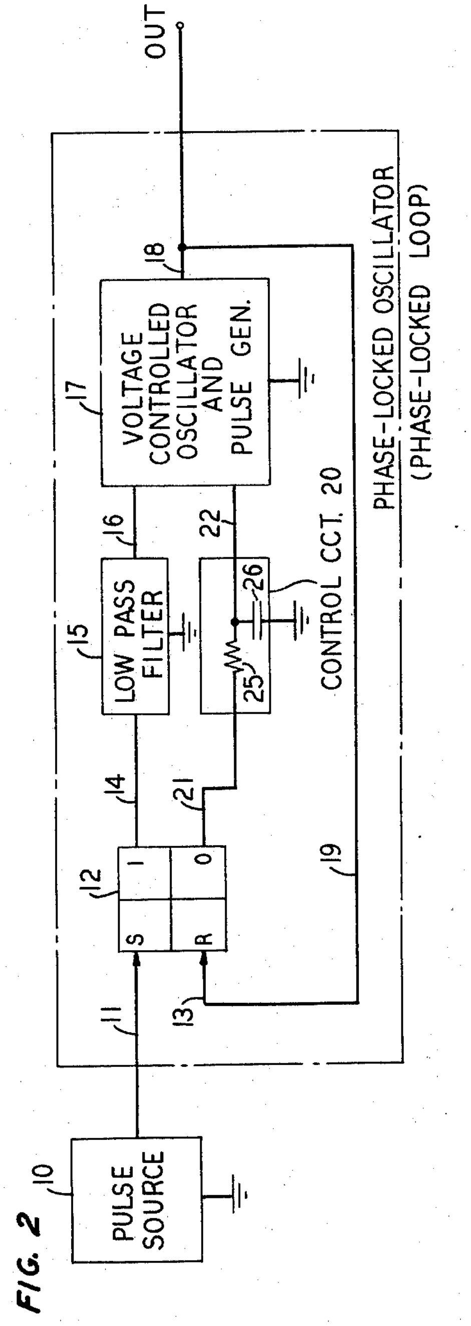
FIG. 2 is a block diagram of an embodiment of the present invention.

In accordance with the present invention, as shown in the embodiment in FIG. 2, control circuit 20 is added in a second path from the phase comparator 12 to the voltage controlled oscillator 17. In the second path the signal appearing at the input of control circuit 20 from output 21 of phase comparator 12 is the complement of the signal appearing at output 14. Each time a set pulse triggers the flip-flop to the "1" state, producing a high voltage at output 14, a low voltage appears at output 21. Conversely, when a reset pulse appears to trigger the flip-flop to the "0" state to produce a low voltage at output 14, a high voltage appears at output 21. The signals in the first and second path are placed across opposite ends of the control element in the voltage controlled oscillator. Typical prior art voltage controlled oscillator circuits with such control elements are shown in FIG. 5–8 on page 57 in the Gardner reference cited above.

Control circuit 20, consisting of series resistor 25 and shunt capacitor 26, has a large time constant so that only a substantially direct-current signal will pass to input 22 of voltage controlled oscillator 14. A direct-current signal is provided only if there is a steady state difference between the input frequency and the frequency of the voltage controlled oscillator. Thus, the signal from control circuit 20 affects only the static offset and does not appreciably affect the transient response of the phase-locked oscillator. Since the complementary signals from the phase comparator are added in the voltage controlled oscillator, the direct-current signal in the first control path is effectively reduced by a factor of two. The advantage gained is that the desired result may be achieved efficiently and without the use of an amplifier.

The operation of control circuit 20 may be more fully explained by means of the following illustration. Assume for example that a static offset signal of unit 1 is necessary to adjust the frequency of the voltage controlled oscillator to the input frequency from pulse source 10 Without control circuit 20 the entire 1 unit would have to be supplied from output 14 through low-pass filter 15. As a result the operating capacity of the phase comparator would be diminished and the associated filtering capacity of the phase-locked oscillator would also be reduced because more unwanted jitter would have to be tracked to prevent a discontinuity in the output of the phase comparator. With control circuit 20, a (+½) unit will be supplied from output 14 and a (−½) unit will be supplied from output 21. At the voltage controlled oscillator 17 inputs 16 and 22 are placed across opposite ends of the control diode so that the total voltage change is the necessary 1 unit. As can be appreciated, in this relatively simple manner with the use of only a resistor and a capacitor the static offset signal from the phase comparator is reduced by a factor of two.

It should be noted that low-pass filter 15 has a larger bandwidth than control circuit 20 in order to pass specific portions of the jitter component in the input signal so that a discontinuity may be avoided in the output of the phase comparator. It should be emphasized, however, that portions of the jitter component are passed only because of the limited capacity of phase comparator 12 as described above. With a small static offset signal, the phase comparator can tolerate greater phase changes in the input signal. Thus, in this efficient manner, the overall filtering capacity of the phase-locked oscillator is maintained closer to the maximum level of 180 degrees. The technique described above may be applied to a variety of phase-locked oscillator circuits well known in the prior art. The only requirement is that the signal in the second path be the inverse of the signal in the first path.

In addition, it should be understood that the above-described embodiment is merely illustrative of the principles of the invention. Various modifications in phase-locked oscillator circuits in accordance with the invention may be effected by persons skilled in the art without departing from the spirit and scope of the invention.

What is claimed is:

1. In combination with a phase-locked oscillator of the type comprising:

a voltage controlled oscillator having a first and second input terminal and an output terminal;

a phase comparator having a first input terminal for receiving an input signal from an independent source and a second input terminal for receiving a signal from the output of said voltage controlled oscillator, and first and second output terminals, the signal at said second output terminal being the complement of the signal at said first output terminal; and filtering means for providing a control signal having a direct-current voltage component from said first output of said phase comparator to said first input of said voltage controlled oscillator to match the frequency of said signal from said voltage controlled oscillator with said signal from said independent source;

the improvement comprising means connected to said second output of said phase comparator for providing a direct-current voltage control signal to said second input of said voltage controlled oscillator to reduce the direct-current voltage component in said control signal from said first output of said phase comparator.

2. Apparatus in accordance with claim 1 wherein said means for providing a direct-current voltage control signal consists of a resistor connected between said second output of said phase comparator and said second input of said voltage controlled oscillator and a capacitor connected in parallel with said resistor.

3. In combination with a phase-locked oscillator of the type comprising:

a voltage controlled oscillator having a first and second input terminal and an output terminal;

a pulse generator circuit connected to the output of said voltage controlled oscillator for generating one output pulse for each oscillation cycle of said voltage controlled oscillator;

a phase comparator comprising a bistable circuit with a first input terminal for receiving an input signal from an independent pulse source and a second input terminal for receiving the signal from the output of said pulse generator circuit, and first and second output terminals, the signal at said second output terminal being the complement of the signal at the input of said first terminal; and filtering means connected between said first output of said bistable circuit and said first input of said voltage controlled oscillator for providing a control signal having a direct-current voltage component to match the frequency of said output signals from said voltage controlled oscillator and said pulse generator with said signal from said independent pulse source;

the improvement comprising integrating means consisting of a series resistor and a shunt capacitor connected between said second output of said bistable circuit and said second input of said voltage controlled oscillator for providing a substantially direct-current voltage signal to said voltage controlled oscillator in order to reduce the direct-current voltage component in the signal path from said first output of said bistable circuit to said second input of said voltage controlled oscillator.

4. A phase-locked oscillator circuit supplied with a time varying input signal from an independent source comprising:

a voltage controlled oscillator having an output terminal and a control element with a pair of input terminals;

a phase comparator having a first input terminal for receiving said input signal and a second input terminal for receiving a signal from the output of said voltage controlled oscillator and first and second output terminals, the signal at said second output terminal being the complement of the signal at said first output terminal;

filtering means connected from one of said output terminals of said phase comparator to one of said pair of input terminals of said control element for supplying a control signal with a direct-current component to said voltage controlled oscillator;

means consisting of a series resistor and a shunt capacitor connected between the other of said output terminals of said phase comparator to the other of said pair of input terminals of said control element for supplying a substantially direct-current signal to said other input of said control element so that the direct-current component appearing through said filtering means to match the frequency of said voltage controlled oscillator with the frequency of said input signal is reduced.

No references cited.

JOHN KOMINSKI, Primary Examiner

U.S. Cl. X.R.

331—17, 25